United States Patent
Lam et al.

(10) Patent No.: US 11,258,013 B2
(45) Date of Patent: Feb. 22, 2022

(54) METHOD OF MANUFACTURING PHASE CHANGE MEMORY

(71) Applicants: Jiangsu Advanced Memory Technology Co., Ltd., Jiangsu (CN); Jiangsu Advanced Memory Semiconductor Co., Ltd., Jiangsu (CN)

(72) Inventors: Chung-Hon Lam, Hsinchu County (TW); Yu Zhu, Hsinchu County (TW); Kuo-Feng Lo, Hsinchu County (TW)

(73) Assignees: JIANGSU ADVANCED MEMORY TECHNOLOGY CO., LTD., Jiangsu (CN); JIANGSU ADVANCED MEMORY SEMICONDUCTOR CO., LTD., Jiangsu (CN)

( * ) Notice: Subject to any disclaimer, the term of this patent is extended or adjusted under 35 U.S.C. 154(b) by 29 days.

(21) Appl. No.: 16/935,210

(22) Filed: Jul. 22, 2020

(65) Prior Publication Data
US 2021/0376238 A1    Dec. 2, 2021

(30) Foreign Application Priority Data
May 29, 2020   (CN) .................. 202010479561.X

(51) Int. Cl.
  *H01L 45/00*   (2006.01)
  *H01L 27/24*   (2006.01)

(52) U.S. Cl.
  CPC ...... *H01L 45/1675* (2013.01); *H01L 27/2409* (2013.01); *H01L 45/06* (2013.01); *H01L 45/1233* (2013.01); *H01L 45/1253* (2013.01); *H01L 45/1641* (2013.01)

(58) Field of Classification Search
  CPC ............. H01L 45/1675; H01L 45/1641; H01L 27/2409
  See application file for complete search history.

(56) References Cited

U.S. PATENT DOCUMENTS

| | | | |
|---|---|---|---|
| 2011/0278528 A1* | 11/2011 | Lung | H01L 45/144 257/2 |
| 2019/0288192 A1* | 9/2019 | Takahashi | H01L 45/124 |
| 2020/0287133 A1* | 9/2020 | Sarkar | H01L 45/1675 |

* cited by examiner

*Primary Examiner* — Mounir S Amer
(74) *Attorney, Agent, or Firm* — CKC & Partners Co., LLC

(57) ABSTRACT

A method of manufacturing a phase change memory includes: forming a stacked structure including a conductive layer; a lower electrode layer over the conductive layer; an upper electrode layer over the lower electrode layer; and a phase change material between the lower and upper electrode layers; etching the upper electrode layer according to a first mask to form an upper electrode wire; simultaneously etching the phase change material according to the upper electrode wire and performing a nitridizing treatment in a same plasma etching chamber until a phase change material layer and a nitridized phase change material layer are formed beneath the upper electrode wire and a portion of the lower electrode layer is exposed, wherein the nitridized phase change material layer covers a side surface of the phase change material layer; and removing the portion of the lower electrode layer and the conductive layer therebeneath.

10 Claims, 10 Drawing Sheets

METHOD OF MANUFACTURING PHASE CHANGE MEMORY

CROSS-REFERENCE TO RELATED APPLICATION

This application claims priority to China Application Serial Number 202010479561.X, filed May 29, 2020, which is herein incorporated by reference.

BACKGROUND

Field of Invention

The present invention relates to a method of manufacturing a phase change memory.

Description of Related Art

Electronic products (e.g., mobile phones, tablets, and digital cameras) often have memory elements that store data. Conventional memory elements can store information through storage nodes of memory cells. Among them, the phase change memory uses resistance states (e.g., high resistance and low resistance) of the memory element to store information. The memory element may have a material that can be switched between different phase states (e.g., a crystalline phase and an amorphous phase). The different phase states enable the memory cell to have different resistance states for representing different values of stored data.

Generally, the phase change memory includes an upper electrode, a lower electrode, and a phase change material layer between the upper electrode and the lower electrode. Lithography and etching processes are commonly used to manufacture the phase change memory.

SUMMARY

The present invention provides a method of manufacturing a phase change memory, which includes: forming a stacked structure including a conductive layer; a lower electrode layer disposed over the conductive layer; an upper electrode layer disposed over the lower electrode layer; and a phase change material disposed between the lower electrode layer and the upper electrode layer; etching the upper electrode layer according to a first mask to form an upper electrode wire; simultaneously etching the phase change material according to the upper electrode wire and performing a nitridizing treatment in a same plasma etching chamber until a phase change material layer and a nitridized phase change material layer are formed beneath the upper electrode wire and a portion of the lower electrode layer is exposed, in which the nitridized phase change material layer covers a side surface of the phase change material layer; and removing the portion of the lower electrode layer and the conductive layer therebeneath to form a lower electrode wire and a conductive wire therebeneath.

In some embodiments, etching the phase change material and performing the nitridizing treatment are alternately performed.

In some embodiments, etching the phase change material and performing the nitridizing treatment are both continuously performed.

In some embodiments, the nitridizing treatment is performed intermittently while continuously etching the phase change material.

In some embodiments, the nitridizing treatment is performed by introducing a nitrogen-containing gas into the plasma etching chamber, and the nitrogen-containing gas includes nitrogen, ammonia or a combination thereof.

In some embodiments, etching the phase change material according to the upper electrode wire includes etching the phase change material using inductively coupled plasma (ICP), plasma ion sputtering or a combination thereof.

In some embodiments, a width of the phase change material layer is smaller than a width of the upper electrode wire.

In some embodiments, a side surface of the nitridized phase change material layer is coplanar with a side surface of the upper electrode wire.

In some embodiments, the method further includes forming an isolation material layer laterally adjacent to the upper electrode wire, the phase change material layer, the nitridized phase change material layer, the lower electrode wire and the conductive wire; etching the upper electrode wire according to a second mask to form a plurality of upper electrode units; etching the phase change material layer according to the upper electrode units to form a plurality of phase change units beneath the upper electrode units, respectively; and etching the lower electrode wire according to the phase change units to form a plurality of lower electrode units beneath the phase change units, respectively.

In some embodiments, etching the phase change material layer according to the upper electrode units includes etching the phase change material layer according to the upper electrode units and performing another nitridizing treatment until the phase change units and another nitridized phase change material layer are formed beneath the upper electrode units and a plurality of portions of the lower electrode wire are exposed, in which the other nitridized phase change material layer covers a side surface of each of the phase change units.

It should be understood that the above general description and the following detailed description are exemplary and are intended to provide a further explanation of the claimed invention.

BRIEF DESCRIPTION OF THE DRAWINGS

The present invention can be more fully understood by reading the following detailed description of the embodiments and referring to the accompanying drawings.

DETAILED DESCRIPTION

In order that the present invention is described in detail and completeness, implementation aspects and specific embodiments of the present invention with illustrative description are presented, but it is not the only form for implementation or use of the specific embodiments of the present invention. The embodiments disclosed herein may be combined or substituted with each other in an advantageous manner, and other embodiments may be added to an embodiment without further description. In the following description, numerous specific details will be described in detail in order to enable the reader to fully understand the following embodiments. However, the embodiments of the present invention may be practiced without these specific details.

Further, spatially relative terms, such as "beneath," "over," and the like, may be used herein for ease of description to describe one element or feature's relationship to another element(s) or feature(s) as shown in the figures. The true meaning of the spatially relative terms includes other orientations. For example, when the figure is flipped up and down by 180 degrees, the relationship between one component and another component may change from "beneath" to "over." The spatially relative descriptions used herein should be interpreted the same.

As described in the section of "Description of Related Art", the lithography and etching processes are commonly used to manufacture the phase change memory. However, the phase change material layer in the phase change memory is very vulnerable to subsequent etching processes and thus is seriously damaged. Therefore, how to prevent the phase change material layer from being seriously damaged during the subsequent etching processes has become an important issue in this technical field.

Accordingly, the present invention provides a method of manufacturing a phase change memory by forming a nitridized phase change material layer on an exposed surface of the phase change material layer that can protect the phase change material layer to prevent the phase change material layer from being seriously damaged during the subsequent etching processes. Various embodiments of the method of manufacturing the phase change memory will be described in detail below.

FIGS. 1, 2, 3A-3E, 4A-4B, 5, 6, 7, 8A-8B and 9 are schematic diagrams of a method of manufacturing a phase change memory at various stages according to some embodiments of the present invention.

Figure 1:
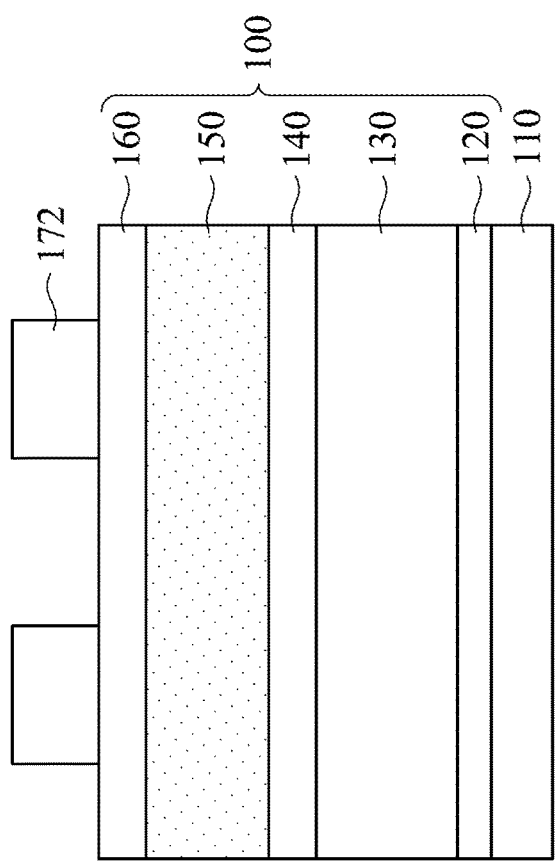

As shown in FIG. 1, a stacked structure 100 is formed, which includes a conductive layer 120, a lower electrode layer 140, an upper electrode layer 160, and a phase change material 150. In some embodiments, the stacked structure 100 is formed over a substrate 110. In some embodiments, the substrate 110 is a semiconductor substrate, such as a silicon substrate, but is not limited thereto, and other suitable materials may be used as the substrate 110, such as ceramic materials, organic materials, or glass materials.

In some embodiments, a material of the conductive layer 120 includes metallic materials, such as titanium, tantalum, tungsten, aluminum, copper, molybdenum, platinum, titanium nitride, tantalum nitride, tantalum carbide, tantalum silicon nitride, tungsten nitride, molybdenum nitride, molybdenum oxynitride, ruthenium oxide, titanium aluminum, titanium aluminum nitride, tantalum carbonitride, other suitable materials or a combination thereof. In some embodiments, the conductive layer 120 may be subsequently patterned to form a plurality of conductive wires parallel to each other, and these conductive wires may act as word lines or bit lines.

In some embodiments, the lower electrode layer 140 and the upper electrode layer 160 include metallic materials, such as tungsten, titanium, titanium nitride, tantalum nitride, aluminum titanium nitride, aluminum tantalum nitride, or a combination thereof.

In some embodiments, the phase change material 150 includes germanium antimony tellurium ($Ge_2Sb_2Te_5$, $Ge_3Sb_6Te_5$, GST), antimony telluride ($Sb_2Te$), antimony germanium (GeSb), indium-doped antimony telluride (In-doped $Sb_2Te$) or a combination thereof.

In some embodiments, the stacked structure 100 further includes a selector material 130 located between the conductive layer 120 and the lower electrode layer 140. In some embodiments, the selector material 130 includes a semiconductor material, such as silicon. In some embodiments, the selector material 130 includes a PN diode.

In some embodiments, the conductive layer 120, the selector material 130, the lower electrode layer 140, the phase change material 150, and the upper electrode layer 160 are blanket formed over the substrate 110 in sequence, as shown in FIG. 1.

Figure 2:
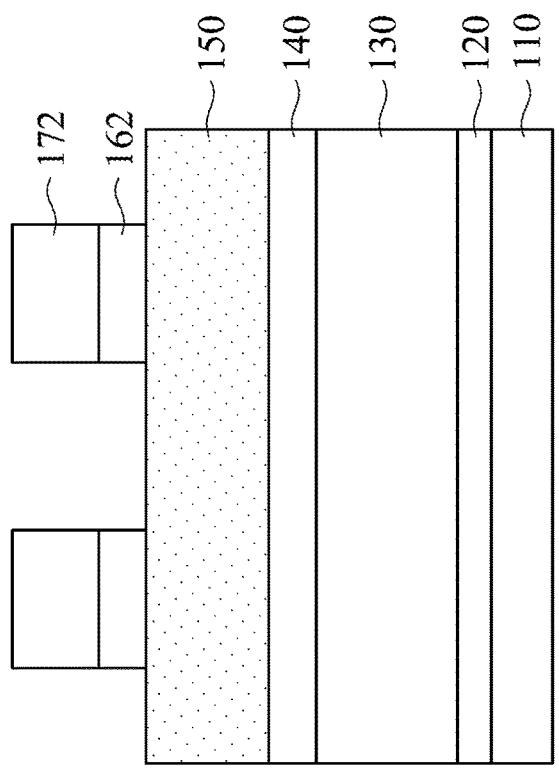
FIGS. 1, 2, 3A-3E, 4A-4B, 5, 6, 7, 8A-8B and 9 are schematic diagrams of a method of manufacturing a phase change memory at various stages according to some embodiments of the present invention.

Subsequently, as shown in FIGS. 1 and 2, a first mask 172 is formed over the stacked structure 100, and the upper electrode layer 160 is then etched according to the first mask 172 to form an upper electrode wire 162. In some embodiments, the first mask 172 is, for example, a photoresist (PR) or a hard mask (HM). In some embodiments, the process of etching the upper electrode layer 160 is, for example, a dry etching process or a wet etching process. In some embodiments, the dry etching process for etching the upper electrode layer 160 is, for example, a plasma etching process using a gas including $Cl_2$, $BCl_3$, $SF_6$, or any combination thereof. In some embodiments, the wet etching process for etching the upper electrode layer 160 is, for example, a wet etching process using an etching solution including phosphoric acid, nitric acid, and acetic acid.

Figure 3B:
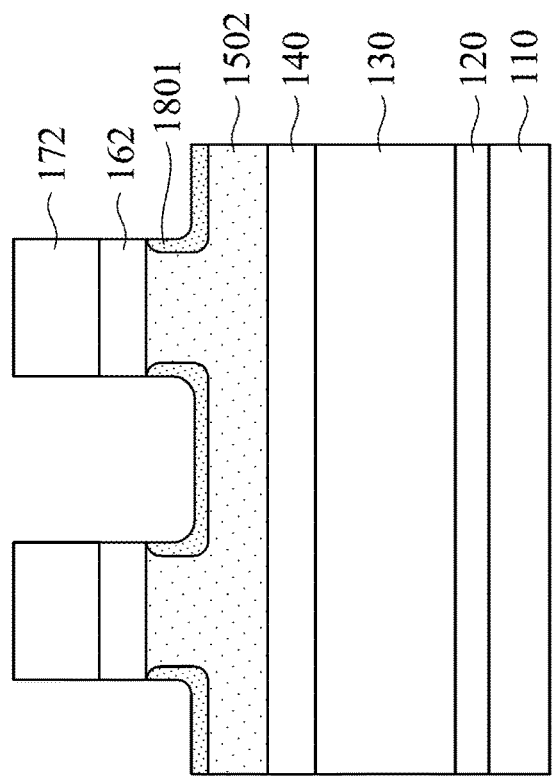
Figure 3A:
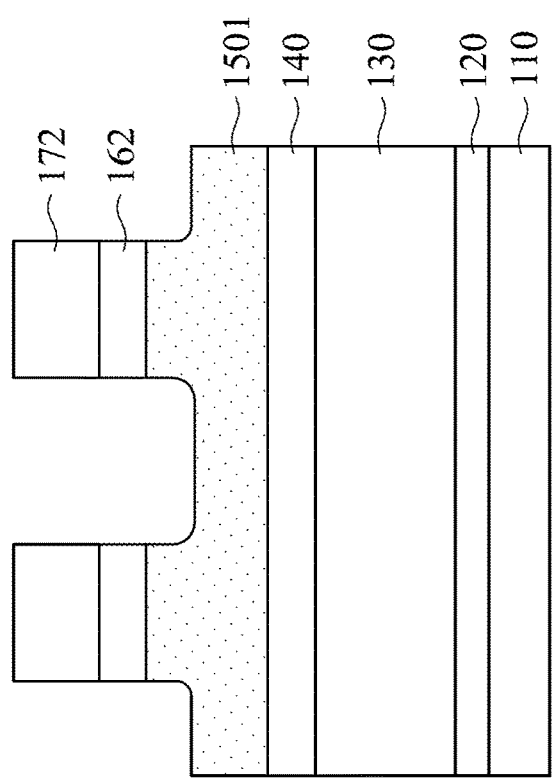
Figure 3D:
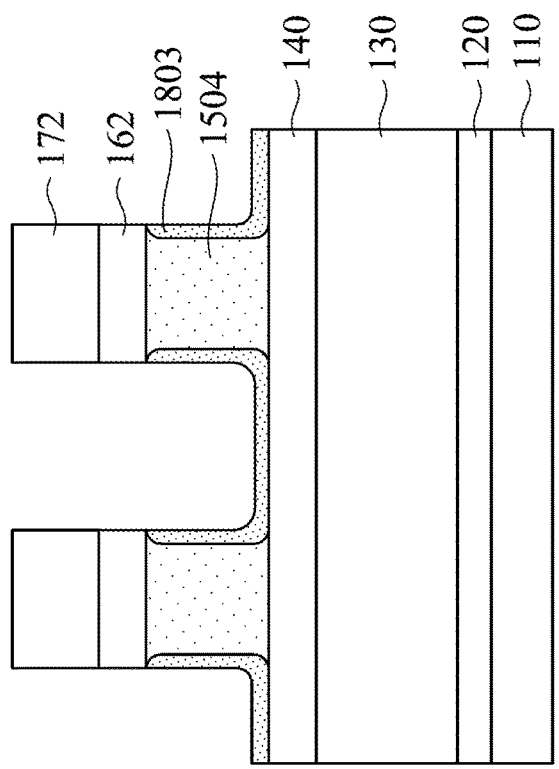
Figure 3C:
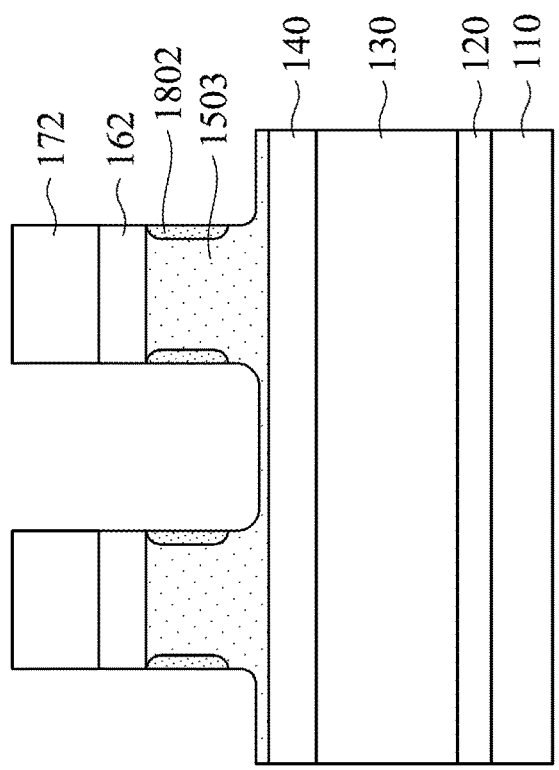
Figure 3E:
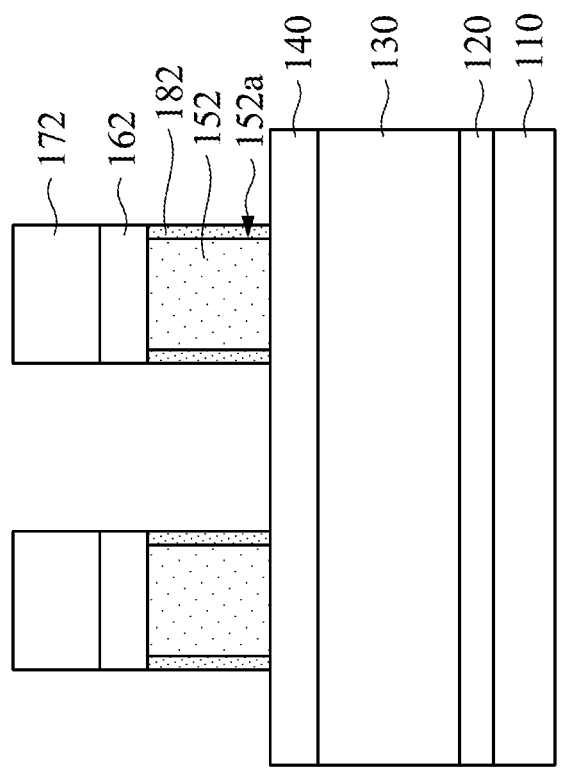

Next, as shown in FIGS. 2 and 3E, etching the phase change material 150 according to the upper electrode wire 162 and a nitridizing treatment are performed simultaneously until a phase change material layer 152 and a nitridized phase change material layer 182 are formed beneath the upper electrode wire 162 and a portion of the lower electrode layer 140 is exposed. The nitridized phase change material layer 182 covers a side surface 152a of the phase change material layer 152, as shown in FIG. 3E. The nitridized phase change material layer 182 can effectively protect the phase change material layer 152 from damage during subsequent etching processes. In some embodiments, the nitridized phase change material layer 182 includes germanium antimony tellurium nitride, nitrogen-doped germanium antimony tellurium, antimony tellurium nitride, nitrogen-doped antimony tellurium, germanium antimony nitride, nitrogen-doped germanium antimony or a combination thereof. In addition, as shown in FIG. 3E, a width of the phase change material layer 152 is smaller than a width of the upper electrode wire 162. Preferably, the sum of the widths of the phase change material layer 152 and the nitridized phase change material layer 182 does not protrude outward beyond the width of the upper electrode wire 162 in the lateral X direction.

In some embodiments, etching the phase change material 150 includes etching the phase change material 150 using inductively coupled plasma (ICP), plasma ion sputtering, or a combination thereof. The nitridized phase change materials, such as germanium antimony tellurium nitride, nitrogen-doped germanium antimony tellurium, antimony tellurium nitride, nitrogen-doped antimony tellurium, germanium antimony nitride, nitrogen-doped germanium antimony, or a combination thereof, can also be etched by the processes mentioned above. In some embodiments, chlorine-based (Cl-based), fluorine-based (F-based) or bromine-based (Br-based) plasma and gas such as helium or argon are used in the inductively coupled plasma etching process.

In some embodiments, performing the nitridizing treatment includes using a nitrogen-containing gas plasma for the nitridizing treatment. In some embodiments, the nitrogen-containing gas plasma includes nitrogen plasma, ammonia plasma, or a combination thereof. In some embodiments, a process temperature of the nitridizing treatment is in a range of from 200° C. to 400° C. In some embodiments, the nitrogen-containing gas includes nitrogen, ammonia, or a combination thereof, which can react with the phase change material 150 to form the nitridized phase change material.

It should be noted that in the present invention, simultaneously etching the phase change material 150 and performing the nitridizing treatment is defined as "simultaneously" performing both etching and nitridizing treatment "in a same plasma etching chamber", and this can be achieved using different process flows. For example, in some embodiments, a first process flow is to etch the phase change material 150 and to perform the nitridizing treatment alternately in the same plasma etching chamber, as shown in FIGS. 2 and 3A-3E. Specifically, as shown in FIGS. 2 and 3A, first, the phase change material 150 is anisotropically etched according to the upper electrode wire 162, and the etching is stopped after a phase change material 1501 shown in FIG. 3A is formed. Next, as shown in FIGS. 3A-3B, the nitrogen-containing gas is introduced, and the nitrogen-containing gas is excited to form a nitrogen-containing gas plasma to react with a surface of the phase change material 1501 to form a phase change material 1502 and a nitridized phase change material 1801 shown in FIG. 3B, and the introduction of the nitrogen-containing gas is then stopped. Next, as shown in FIGS. 3B and 3C, the etching is performed again, that is, the phase change material 1502 and the nitridized phase change material layer 1801 are anisotropically etched, and the etching is stopped after a phase change material 1503 and a nitridized phase change material 1802 shown in FIG. 3C are formed. Next, as shown in FIGS. 3C-3D, the nitrogen-containing gas is introduced again, and the nitrogen-containing gas is excited to form the nitrogen-containing gas plasma to react with the phase change material 1503 to form a phase change material 1504 and a nitridized phase change material layer 1803 shown in FIG. 3D, and the introduction of the nitrogen-containing gas is then stopped. The first process flow is to repeatedly perform the anisotropic etching and the nitridizing treatment in the same plasma etching chamber in an alternating manner. After the last etching process, the portion of the lower electrode layer 140 is exposed, as shown in FIG. 3E, in which the nitridized phase change material layer 182 covers the side surface 152a of the phase change material layer 152, and thus "simultaneously" performing the etching and the nitridizing treatment "in the same plasma etching chamber" are completed.

In some embodiments, a second process flow is to etch the phase change material 150 and to perform the nitridizing treatment both continuously in the same plasma etching chamber, as shown in FIGS. 2, 3B, 3D and 3E. Specifically, in some embodiments, as shown in FIGS. 2 and 3B, the phase change material 150 is continuously anisotropically etched according to the upper electrode wire 162, and the nitrogen-containing gas is continuously introduced. In one aspect, the nitrogen-containing gas is excited to form a nitrogen-containing gas plasma to react with a surface of the phase change material 150 to form a nitridized phase change material. In another aspect, anisotropic etching is performed continuously, so that both the phase change material and the nitridized phase change material are gradually etched away. Accordingly, a phase change material 1502 and a nitridized phase change material 1801 shown in FIG. 3B are formed. After the anisotropic etching and the nitridizing treatment are continuously performed, a phase change material 1504 and a nitridized phase change material 1803 shown in FIG. 3D are formed. Finally, the anisotropic etching and the nitridizing treatment are continuously performed, and the phase change material layer 152 and the nitride 182 shown in FIG. 3E are formed, in which the nitridized phase change material layer 182 covers the side surface 152a of the phase change material layer 152, and thus "simultaneously" performing the etching and the nitridizing treatment "in the same plasma etching chamber" are completed.

In some embodiments, a third process flow is to perform the nitridizing treatment intermittently while continuously etching the phase change material 150, as shown in FIGS. 2 and 3A-3E. Specifically, in some embodiments, as shown in FIGS. 2 and 3A, the phase change material 150 is continuously anisotropically etched according to the upper electrode wire 162 to form a phase change material 1501 shown in FIG. 3A. Next, as shown in FIGS. 3A-3B, when the phase change material 1501 is continuously etched, the nitrogen-containing gas is introduced in pulse manner and excited to form a nitrogen-containing gas plasma. The nitrogen-containing gas plasma reacts with the phase change material 1501. After a phase change material 1502 and a nitridized phase change material 1801 shown in FIG. 3B are formed, the introduction of the nitrogen-containing gas is stopped. Subsequently, as shown in FIGS. 3B and 3C, the phase change material 1502 and the nitridized phase change material 1801 are continuously anisotropically etched, so that a phase change material 1503 and a nitridized phase change material 1802 shown in FIG. 3C are formed. Next, as shown in FIGS. 3C-3D, when the phase change material 1503 and the nitridized phase change material 1802 are continuously etched, the nitrogen-containing gas is introduced in pulse manner again, and the nitrogen-containing gas plasma reacts with the phase change material 1503. After a phase change material 1504 and a nitridized phase change material 1803 shown in FIG. 3D are formed, the introduction of the nitrogen-containing gas is stopped. Finally, as shown in FIGS. 3D and 3E, the nitridized phase change material 1803 is continuously anisotropically etched, and the phase change material layer 152 and the nitridized phase change material layer 182 shown in FIG. 3E are finally formed, in which the nitridized phase change material layer 182 covers the side surface 152a of the phase change material layer 152, and thus "simultaneously" performing the etching and the nitridizing treatment "in the same plasma etching chamber" are completed.

It is beneficial to "simultaneously" perform the etching and the nitridizing treatment "in the same plasma etching chamber" because the wafers do not need to be transferred between the plasma etching chamber and a nitridizing chamber, where the plasma etching chamber and the nitridizing chamber need to achieve stable conditions before etching and nitridizing treatment are performed, respectively. Therefore, according to the present invention, "simultaneously" performing the etching and the nitridizing treatment "in the same plasma etching chamber" can significantly reduce manufacturing time of the phase change memory, increase production efficiency, and increase productivity.

Figures 4A, 4B:
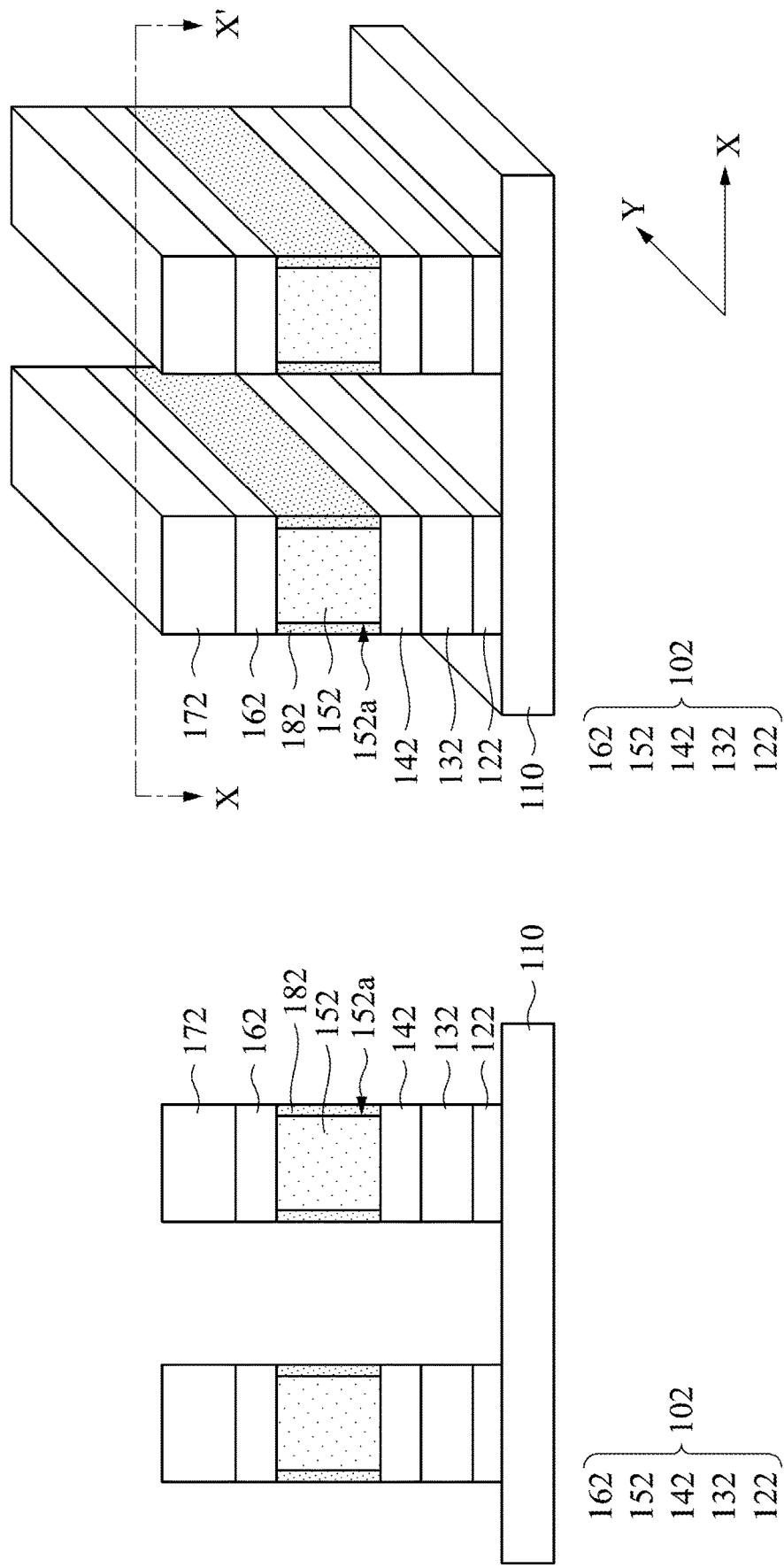

As shown in FIGS. 3E and 4A, after the phase change material layer 152 and the nitridized phase change material layer 182 are formed and the portion of the lower electrode layer 140 is exposed, the exposed portion of the lower electrode layer 140, the selector material 130 and the conductive layer 120 therebeneath are removed to form a lower electrode wire 142, a selector material layer 132 and a conductive wire 122 therebeneath. In some embodiments, the lower electrode layer 140, the selector material 130, and the conductive layer 120 are etched according to the phase change material layer 152 and the nitridized phase change material layer 182 to form the lower electrode wire 142, the selector material layer 132 and the conductive wire 122 therebeneath.

In some embodiments, the process of etching the lower electrode layer 140 is, for example, a dry etching process or a wet etching process. In some embodiments, the dry etching process for etching the lower electrode layer 140 is, for example, a plasma etching process using a gas including $Cl_2$, $BCl_3$, $SF_6$, or any combination thereof. In some embodiments, the wet etching process for etching the lower electrode layer 140 is, for example, a wet etching process using an etching solution including phosphoric acid, nitric acid, and acetic acid.

In some embodiments, the process of etching the selector material 130 to form the selector material layer 132 is to manufacture a PN diode with a vertical profile. Manufacturing the PN diode with the vertical profile is a known technique in this technical field, so the manufacturing process thereof is not repeated here.

In some embodiments, the process of etching the conductive layer 120 is, for example, a dry etching process or a wet etching process. In some embodiments, the dry etching process for etching the conductive layer 120 is, for example, a plasma etching process using a gas including $Cl_2$, $BCl_3$, $SF_6$, or any combination thereof. In some embodiments, the wet etching process for etching the conductive layer 120 is, for example, a wet etching process using an etching solution including phosphoric acid, nitric acid, and acetic acid.

In some embodiments, certain chemicals used in the processes of etching the lower electrode layer 140, the selector material 130, and the conductive layer 120 may cause severe damage to the phase change material layer 152. For example, the etching gas or etching liquid used in the subsequent etching of the lower electrode layer 140, the selector material 130, and the conductive layer 120 will damage the surface of the phase change material layer 152 and cause defects, so that the structural states of the crystalline phase and the amorphous phase of the phase change material layer 152 and the resistance values thereof have been different from those before the damage. Therefore, although the phase change material layer 152 can still be switched between the crystalline phase and the amorphous phase, the change of resistance value before and after the conversion will deviate from the originally predetermined change of resistance value. However, in the present invention, the nitridized phase change material layer 182 formed covering the side surface 152a of the phase change material layer 152 can protect the phase change material layer 152 from these chemicals during subsequent etching processes and ensure that the resistance states (e.g., high resistance and low resistance) of the phase change material layer 152 used to store information are not affected, thereby improving the performance of the memory element.

FIG. 4A is a cross-sectional view taken along line X-X' of FIG. 4B according to some embodiments of the present invention. In some embodiments, as shown in FIG. 4B, the conductive wire 122, the selector material layer 132, the lower electrode wire 142, the phase change material layer 152, and the upper electrode wire 162 extend along the Y direction and constitute a stacked structure 102.

Figure 5:
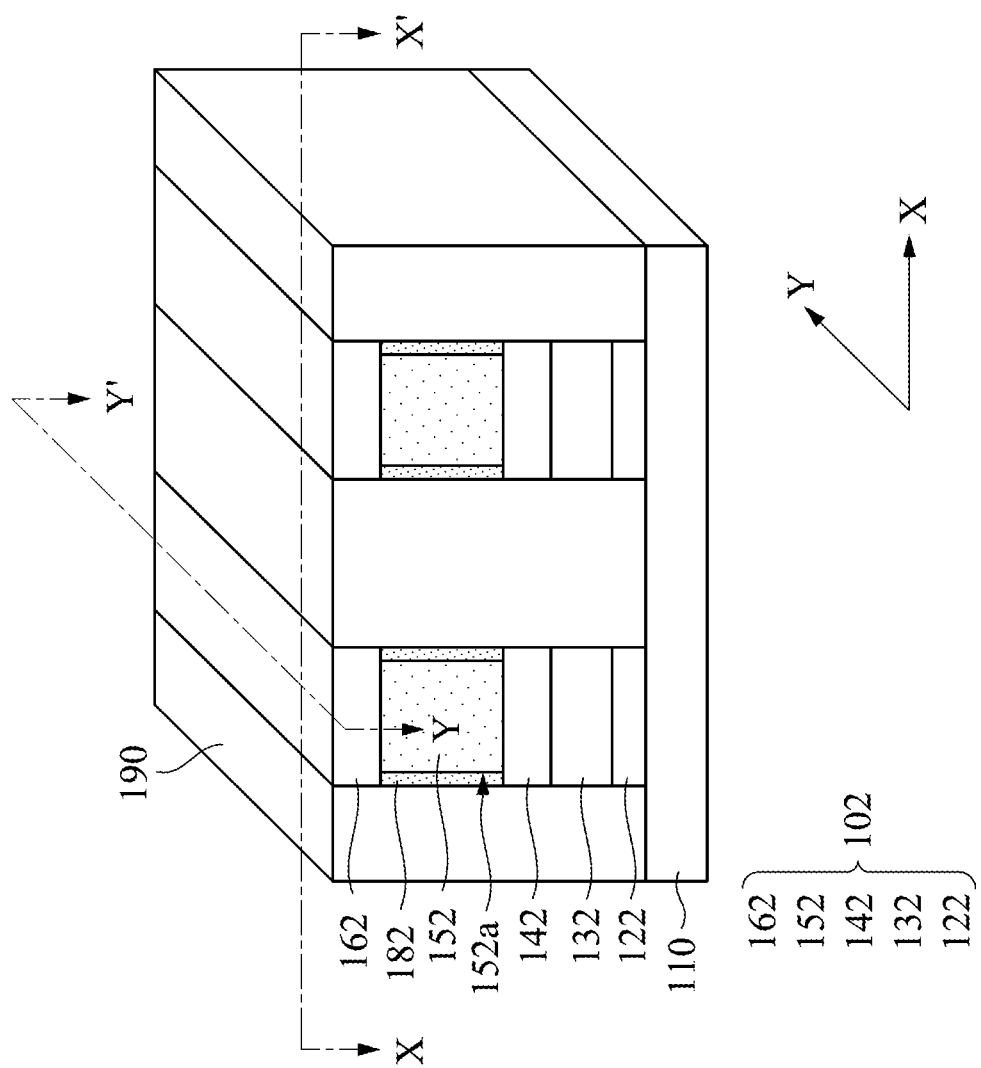

As shown in FIGS. 4B and 5, an isolation material layer 190 is formed laterally adjacent to the upper electrode wire 162, the phase change material layer 152 and the nitridized phase change material layer 182, the lower electrode wire 142, the selector material layer 132 and the conductive wire 122. More specifically, in some embodiments, an isolation material layer 190 is deposited over the first mask 172 and the stacked structure 102 and between the two stacked structures 102 shown in FIG. 4B, and a polishing process (e.g., a chemical mechanical polishing process) is performed to remove the first mask 172 and excess isolation material, so that a top surface of the polished isolation material layer 190 is coplanar with a top surface of the upper electrode wire 162 (as shown in FIG. 5). In some embodiments, the isolation material includes oxide, nitride, oxynitride, or a combination thereof, such as silicon oxide, silicon nitride, silicon oxynitride, or a combination thereof. In some embodiments, a chemical vapor deposition process may be used to deposit the isolation material.

Figure 6:
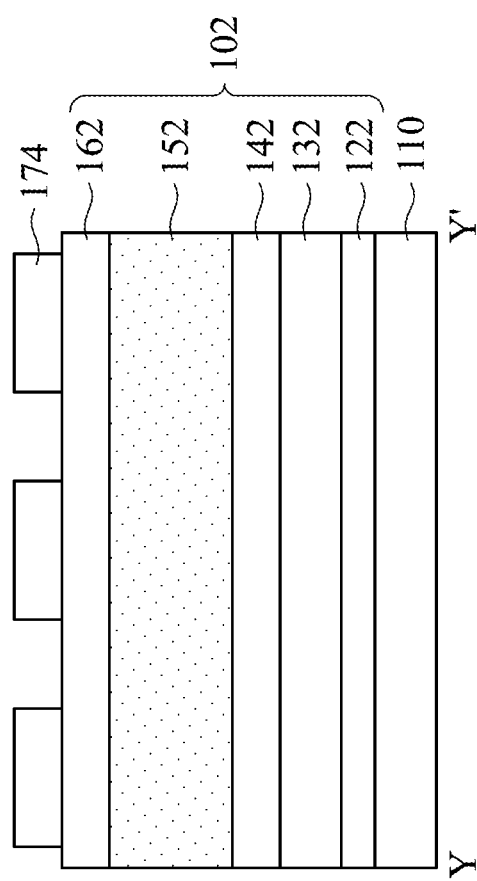

FIG. 6 is a cross-sectional view taken along line Y-Y' of FIG. 5 according to some embodiments of the present invention. As shown in FIGS. 5 and 6, after the isolation material layer 190 is formed, a second mask 174 is formed over the upper electrode wire 162 of the stacked structure 102. In some embodiments, the second mask 174 is, for example, a photoresist or a hard mask.

Figure 7:
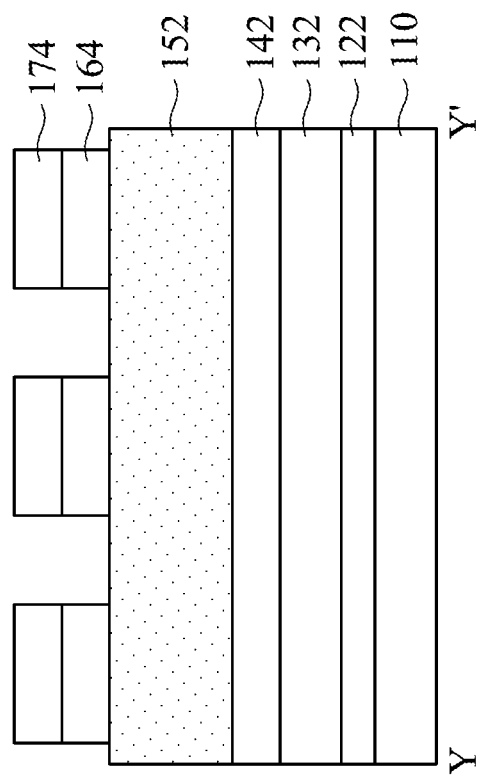

Next, as shown in FIGS. 6 and 7, the upper electrode wire 162 is etched according to the second mask 174 to form a plurality of upper electrode units 164. In some embodiments, the process of etching the upper electrode wire 162 may be the same as the process of etching the upper electrode layer 160, so it will not repeated here.

Figure 8A:
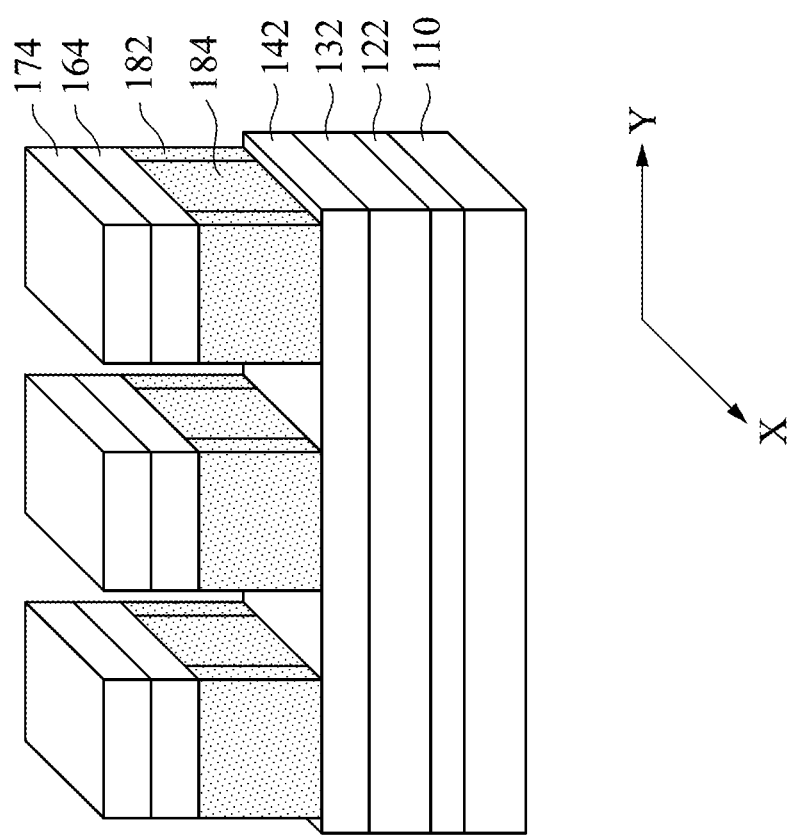
Figure 8B:
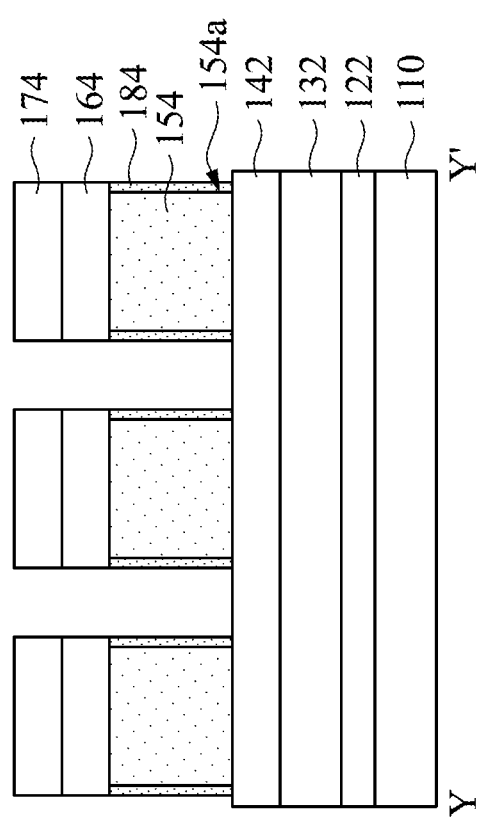

Subsequently, as shown in FIGS. 7 and 8A-8B, the phase change material layer 152 is etched according to the upper electrode unit 164 to form the phase change unit 154 beneath the upper electrode unit 164. In some embodiments, etching the phase change material layer 152 includes etching the phase change material layer 152 using inductively coupled plasma, plasma ion sputtering, or a combination thereof. These processes can also etch the nitridized phase change material layer 182 (not shown in FIG. 7, refer to the nitridized phase change material layer 182 in FIG. 5) not covered by the second mask 174 and the upper electrode unit 164. In addition, the inventor found that the etching rate of the phase change material layer 152 is about equal to that of the nitridized phase change material layer 182.

In some embodiments, as shown in FIGS. 7 and 8A-8B, the phase change material layer 152 is etched according to the upper electrode unit 164 and another nitridizing treatment is performed simultaneously until the phase change unit 154 and a nitridized phase change material layer 184 are formed beneath the upper electrode unit 164 and a portion of the lower electrode wire 142 is exposed. The nitridized phase change material layer 184 covers a side surface 154a of the phase change material layer 154, as shown in FIG. 8B. The nitridized phase change material layer 184 can effectively protect the phase change unit 154 from damage during subsequent etching processes. In some embodiments, the nitridizing treatment includes using a nitrogen-containing gas plasma, which includes nitrogen plasma, ammonia plasma, or a combination thereof. In some embodiments, a process temperature of the nitridizing treatment is in a range of from 200° C. to 400° C. In some embodiments, the nitridized phase change material layer 184 includes germanium antimony tellurium nitride, nitrogen-doped germanium antimony tellurium, antimony tellurium nitride, nitrogen-doped antimony tellurium, germanium antimony nitride, nitrogen-doped germanium antimony or a combination thereof. In addition, as shown in FIG. 8B, a width of the phase change unit 154 is smaller than a width of the upper electrode unit 164. Preferably, the sum of the widths of the phase change unit 154 and the nitridized phase change material layer 184 does not protrude outward beyond the width of the upper electrode unit 164 in the lateral Y direction.

Simultaneous etching and nitridizing treatment shown in FIGS. 8A-8B are the same as those shown in FIG. 3E. That is, in this operation, the etching and the nitridizing treatment are "simultaneously" performed "in the same plasma etching chamber." More specifically, simultaneously etching the phase change material layer 152 and performing another nitridizing treatment means that etching the phase change material layer 152 and introducing another nitrogen-containing gas are alternately performed, or both continuously performed, or the other nitrogen-containing gas is intermittently introduced while continuously etching the phase change material, in which the nitrogen-containing gas can be excited to form a nitrogen-containing gas plasma which reacts with the phase change material layer 152. The operations shown in FIGS. 8A-8B are the same as those shown in FIG. 3E, so description thereof is not repeated here.

Subsequently, with continued reference to FIGS. 8B and 9, after the nitridized phase change material layer 184 is formed, the lower electrode wire 142 and the selector material layer 132 are etched according to the plurality of phase change units 154 to form a plurality of lower electrodes units 144 and a plurality of selectors 134 therebeneath. In some embodiments, the lower electrode wire 142 and the selector material layer 132 are etched according to the phase change units 154 and the nitridized phase change material layer 184 to form the plurality of lower electrode units 144 and the plurality of selectors 134 therebeneath. In some embodiments, the processes of etching the lower electrode wire 142 and the selector material layer 132 may be the same as the processes of etching the lower electrode layer 140 and the selector material 130, so the processes thereof are not repeated here.

In some embodiments, certain chemicals used in the process of etching the lower electrode wire 142 and the selector material layer 132 may cause severe damage to the phase change unit 154. For example, the etching gas or etching liquid used in the subsequent etching of the lower electrode wire 142 and the selector material layer 132 will damage the surface of the phase change unit 154 and cause defects, so that the structural states of the crystalline phase and the amorphous phase of the phase change unit 154 and the resistance value thereof have been different from those before the damage. Therefore, although the phase change unit 154 can still be switched between the crystalline phase and the amorphous phase, the change of resistance value before and after the conversion will deviate from the originally predetermined change of resistance value. However, in the present invention, the nitridized phase change material layer 184 formed covering the side surface 154a of the phase change unit 154 can protect the phase change unit 154 from these chemicals during subsequent etching processes and ensure that the resistance states (e.g., high resistance and low resistance) of the phase change unit 154 used to store information are not affected, thereby improving the performance of the memory element.

Figure 9:
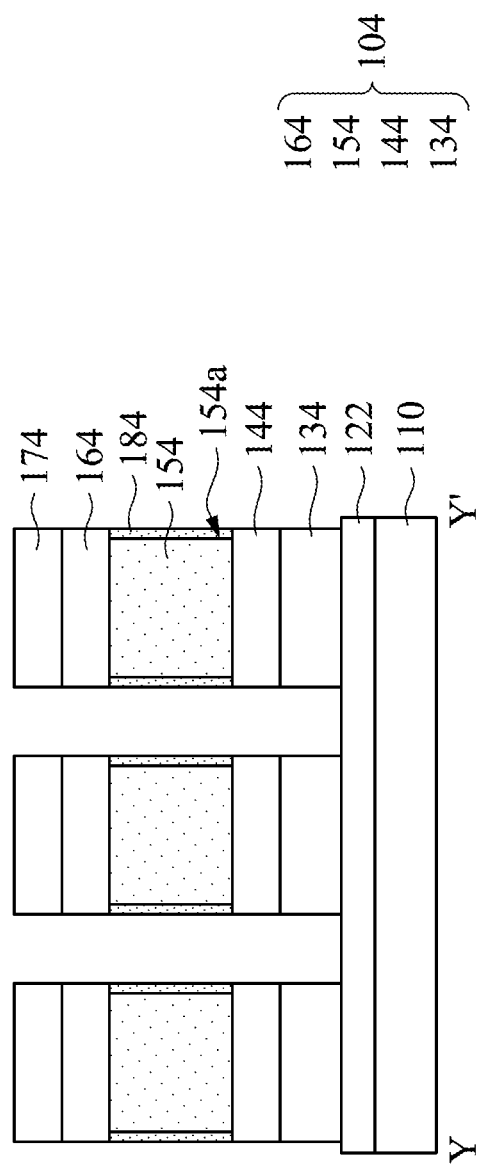

In some embodiments, as shown in FIG. 9, the selector 134, the lower electrode unit 144, the phase change unit 154, and the upper electrode unit 164 constitute a memory cell 104. In some embodiments, another conductive wire (not shown) is formed over the memory cell 104. In some embodiments, viewed from above, the other conductive wire and the conductive wire 122 are perpendicularly crossed with each other, and the other conductive wire and the conductive wire 122 can be acted as a word line and a bit line, respectively.

Preferably, after the etching and nitridizing treatment are simultaneously performed two times, the widths of the phase change unit 154 in the X direction and the Y direction both become narrower and smaller than the width of the upper electrode unit 164, and the sum of the widths of the phase change unit 154 and the nitridized phase change material layer 182/184 does not protrude outward in the lateral X/Y direction beyond the width of the upper electrode unit 164, so a distance between the two adjacent memory cells 104 can be further reduced, which helps to increase density of the memory cells 104 formed over the substrate 110.

Although embodiments of the present invention have been described in considerable detail, other embodiments are possible. Therefore, the spirit and scope of the claim scope of the present invention should not be limited to the description of the embodiments contained herein.

It is obvious to those skilled in the art that various modifications and changes can be made to the structure of the present invention without departing from the scope or spirit of the present invention. In view of the foregoing, the present invention is intended to cover the modifications and changes of the present invention as long as they fall within the claim scope of the present invention.

What is claimed is:

1. A method of manufacturing a phase change memory, comprising:
   forming a stacked structure, the stacked structure comprising:
      a conductive layer;
      a lower electrode layer disposed over the conductive layer;
      an upper electrode layer disposed over the lower electrode layer; and
      a phase change material disposed between the lower electrode layer and the upper electrode layer;
   etching the upper electrode layer according to a first mask to form an upper electrode wire;
   simultaneously etching the phase change material according to the upper electrode wire and performing a nitridizing treatment in a same plasma etching chamber until a phase change material layer and a nitridized phase change material layer are formed beneath the upper electrode wire and a portion of the lower electrode layer is exposed, wherein the nitridized phase change material layer covers a side surface of the phase change material layer; and
   removing the portion of the lower electrode layer and the conductive layer therebeneath to form a lower electrode wire and a conductive wire therebeneath.

2. The method of claim 1, wherein etching the phase change material and performing the nitridizing treatment are alternately performed.

3. The method of claim 1, wherein etching the phase change material and performing the nitridizing treatment are both continuously performed.

4. The method of claim 1, wherein the nitridizing treatment is performed intermittently while continuously etching the phase change material.

5. The method of claim 1, wherein the nitridizing treatment is performed by introducing a nitrogen-containing gas into the plasma etching chamber, and the nitrogen-containing gas comprises nitrogen, ammonia or a combination thereof.

6. The method of claim 1, wherein etching the phase change material according to the upper electrode wire comprises etching the phase change material using inductively coupled plasma (ICP), plasma ion sputtering or a combination thereof.

7. The method of claim 1, wherein a width of the phase change material layer is smaller than a width of the upper electrode wire.

8. The method of claim 1, wherein a side surface of the nitridized phase change material layer is coplanar with a side surface of the upper electrode wire.

9. The method of claim 1, further comprising:
forming an isolation material layer laterally adjacent to the upper electrode wire, the phase change material layer, the nitridized phase change material layer, the lower electrode wire and the conductive wire;
etching the upper electrode wire according to a second mask to form a plurality of upper electrode units;
etching the phase change material layer according to the upper electrode units to form a plurality of phase change units beneath the upper electrode units, respectively; and
etching the lower electrode wire according to the phase change units to form a plurality of lower electrode units beneath the phase change units, respectively.

10. The method of claim 9, wherein etching the phase change material layer according to the upper electrode units comprises etching the phase change material layer according to the upper electrode units and performing another nitridizing treatment until the phase change units and another nitridized phase change material layer are formed beneath the upper electrode units and a plurality of portions of the lower electrode wire are exposed, wherein the other nitridized phase change material layer covers a side surface of each of the phase change units.

* * * * *